US007229913B2

United States Patent
Leong et al.

(10) Patent No.: US 7,229,913 B2
(45) Date of Patent: Jun. 12, 2007

(54) STITCHED MICRO-VIA TO ENHANCE ADHESION AND MECHANICAL STRENGTH

(75) Inventors: Kum Foo Leong, Kedah (MY); Chee Key Chung, Penang (MY); Kian Sin Sim, Penang (MY)

(73) Assignee: Intel Corporation, Santa Clara, CA (US)

( * ) Notice: Subject to any disclaimer, the term of this patent is extended or adjusted under 35 U.S.C. 154(b) by 177 days.

(21) Appl. No.: 10/670,975

(22) Filed: Sep. 25, 2003

(65) Prior Publication Data
US 2005/0067679 A1  Mar. 31, 2005

(51) Int. Cl.
*H01L 21/4763* (2006.01)
(52) U.S. Cl. .................. 438/629; 438/625; 438/650; 438/654; 257/774; 257/775
(58) Field of Classification Search ................ 438/629
See application file for complete search history.

(56) References Cited
U.S. PATENT DOCUMENTS 6,495,200 B1 *  12/2002  Chan et al. ............... 438/626
2005/0181598 A1 *  8/2005  Kailasam ................ 438/654
2005/0215046 A1 *  9/2005  Cohen et al. ............ 438/619

* cited by examiner

*Primary Examiner*—Carl Whitehead, Jr.
*Assistant Examiner*—Colleen E. Rodgers
(74) *Attorney, Agent, or Firm*—Schwegman, Lundberg, Woessner & Kluth, P.A.

(57) ABSTRACT

A method for forming a via in an integrated circuit packaging substrate includes embedding an interfacial adhesion layer at a base of a via, and heating the materials at the base of the via. Embedding the interfacial adhesion layer further includes placing a conductive material over the interfacial adhesion layer. An interfacial layer material is deposited within at the base of opening and a conductive material is placed over the interfacial material. The interfacial layer material is a material that will diffuse into the conductive material at the temperature produced by heating the materials at the base of the via opening. Heating the materials at the base of the via opening includes directing energy from a laser at the base of the opening. An integrated circuit packaging substrate includes a first layer of conductive material, and a second layer of conductive material. The integrated circuit packaging substrate also includes a via for interconnecting the first layer of conductive material and the second layer of conductive material having a base that includes an interfacial adhesion material to stitch the base of the via to a layer of circuitry.

20 Claims, 6 Drawing Sheets

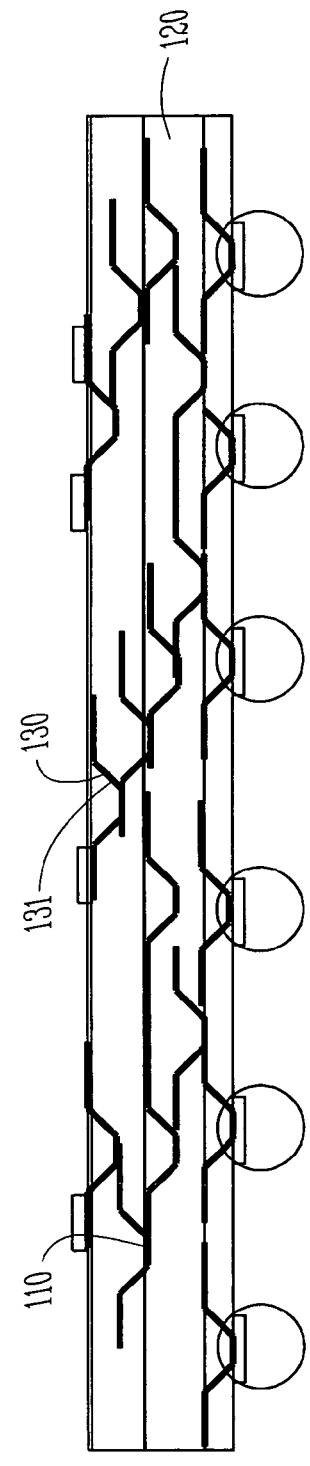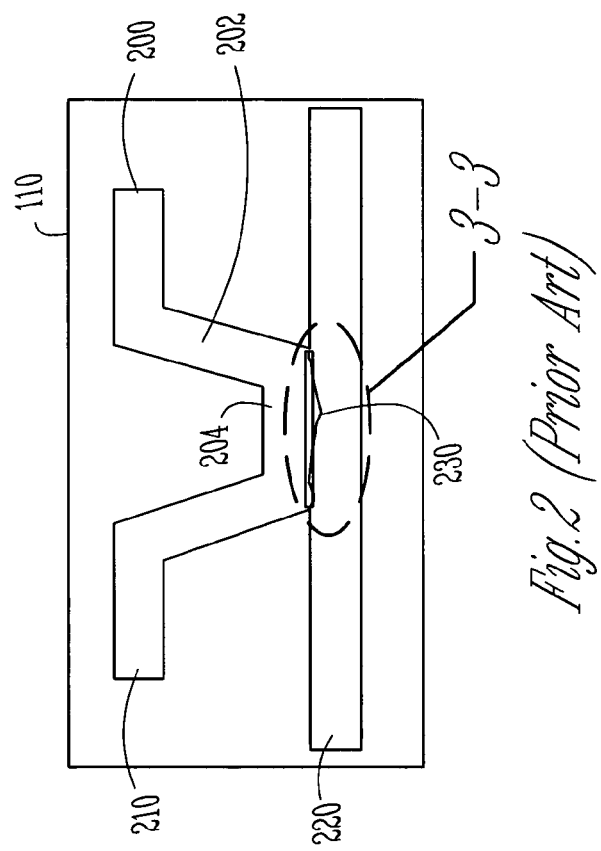
Fig.1
Fig.2 (Prior Art)

STITCHED MICRO-VIA TO ENHANCE ADHESION AND MECHANICAL STRENGTH

FIELD OF THE INVENTION

The present invention is related to formation of structures associated with semiconductor devices. More specifically, the present invention relates to methods and apparatus for forming a stitched micro-via to enhance adhesion and mechanical strength.

BACKGROUND OF THE INVENTION

The semiconductor industry has seen tremendous advances in technology in recent years that have permitted dramatic increases in circuit density and complexity, and equally dramatic decreases in power consumption and package sizes. Present semiconductor technology now permits single-chip microprocessors with many millions of transistors, operating at speeds of several gigahertz (GHz), to be packaged in relatively small, air-cooled semiconductor device packages. A by-product of such high density and high functionality in semiconductor devices has been an ongoing pressure to further miniaturize the individual circuit features within an integrated circuit and packaging substrate, such as a microprocessor or a chip set component or the like.

There are many different features within an integrated circuit packaging substrate. One feature is a via. An integrated circuit packaging substrate contains several levels of circuitry. A via is a vertical opening filled with conducting material used to connect conductor trace on one layer to the next layer. Vias can also provide conductive paths from a layer of integrated circuit to the exterior of the package. As vias are made smaller, there are some occurrences where the structure within the via fails to provide an electrical connection. This is the type of failure that may not occur immediately. Rather, this type of failure may occur after the integrated circuit within a die has been packaged and shipped. One form of this type of failure is delamination of the via structure. This may be due to excessive mechanical stress, contamination of dielectric residues trapped from laser drilling of the via opening, or sulfur contamination on electroless copper (Cu) plating.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures, and:

FIG. 1 is a cross-sectional schematic view of an integrated circuit packaging substrate including a plurality of devices thereon, according to an embodiment of this invention.

FIG. 2 illustrates a schematic cross-sectional view of a delaminated via of the prior art.

Figure 3:
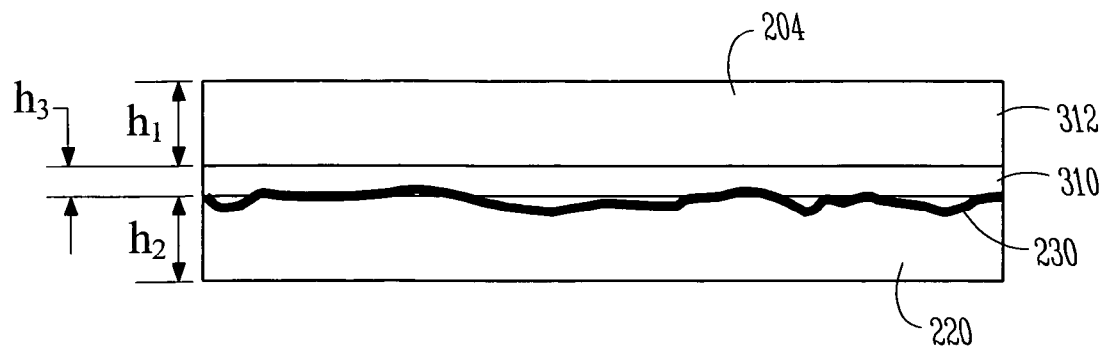
FIG. 3 illustrates a schematic cross-sectional view of the material in an area near the delaminated via of the prior art.

The description set out herein illustrates the various embodiments of the invention, and such description is not intended to be construed as limiting in any manner.

DETAILED DESCRIPTION

In the following detailed description of the preferred embodiments, reference is made to the accompanying drawings that form a part hereof, and in which are shown by way of illustration specific embodiments in which the invention can be practiced. The embodiments illustrated are described in sufficient detail to enable those skilled in the art to practice the teachings disclosed herein. Other embodiments can be utilized and derived therefrom, such that structural and logical substitutions and changes can be made without departing from the scope of present inventions. The following detailed description, therefore, is not to be taken in a limiting sense, and the scope of various embodiments of the invention is defined only by the appended claims, along with the full range of equivalents to which such claims are entitled.

FIG. 1 is a cross-sectional schematic view of an integrated circuit packaging substrate 120 that includes a plurality of devices 110 thereon, according to an embodiment of this invention. The devices 110 provide electrical and physical interface of the packaging substrate 120. In actuality, the devices are embedded inside the packaging substrate 120. Generally, the packaging substrate 120 will include as many as several thousand identical or nearly identical devices 110.

An integrated circuit packaging substrate 120 is processed to form the various layers that form the circuitry within the individual devices. One of the features commonly formed on an integrated circuit packaging substrate 120 and, therefore in an individual circuit associated with a wafer or a chip, is a via 130. A via is a vertical opening filled with conducting material 131 used to connect circuits on the various levels of a device to one another. Vias also provide conductive paths from a level of circuitry to the exterior of the packaging substrate.

FIG. 2 illustrates a schematic cross-sectional view of a delaminated via 200 of the prior art. The via 200 is for connecting circuitry at a first level 210 to circuitry at a second level 220. The via 200 includes a cylindrical or frusto-conical shaped barrel portion 202 and a base 204. It is desirable to have the bottom or base 204 of the via 200 to make a good mechanical and a good electrical connection between the base 204 and the second level of circuitry 220. As shown in FIG. 2, the base, or the bottom of the base 204, is delaminated from the second level of circuitry 220. The delamination is depicted by a crack or spacing which carries the reference numeral 230.

FIG. 3 illustrates a schematic cross-sectional view of the portion of the via where the base interfaces or contacts with the second level of circuitry 220 as presented in the prior art. Essentially FIG. 3 is an exploded view of the encircled section of the via 200 shown in FIG. 2. The delamination is shown by reference line 230 in FIG. 3. The second level of circuitry 220 is formed of a conductive material, such as electrolytic copper. In the prior art, the base 204 of the via 200 includes a layer of electroless copper depicted by reference numeral 310 and a layer of electrolytic copper 312. The electrolytic copper 312 of the via is also used to line the entire cylindrical portion 202 of the via, as well as form a portion of the first level of circuitry 210. The second level of circuitry 220 has a thickness of approximately 1 mil or 25.4 micrometers. The electrolytic copper layer 312 also has a thickness height of approximately 1 ml. or 25.4 micrometers. The thickness height of the second level of circuitry 220 is depicted by the reference numeral $h_2$, while the thickness height of the electrolytic copper layer 312 is depicted by $h_1$. The layer of electroless copper 310 also has a thickness height $h_3$, which is approximately 100 nanometers. The thickness height of the electroless copper layer 310 is depicted by the reference $h_3$.

Figure 4A:
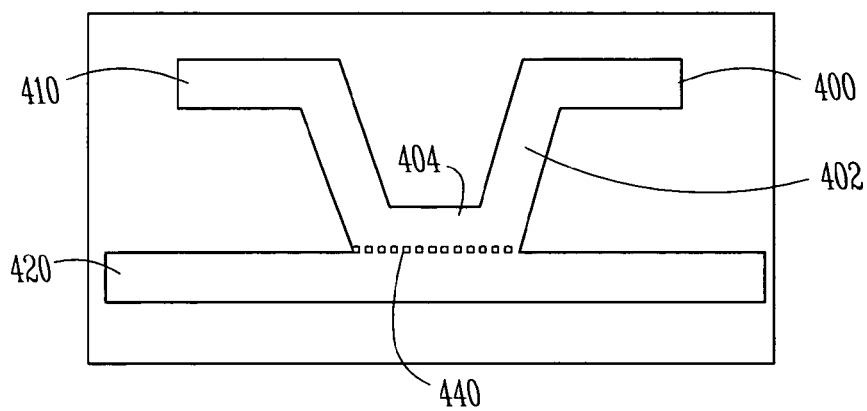
FIG. 4A illustrates a schematic cross-sectional view of a stitched via, according to an embodiment of this invention.

FIG. 4A illustrates a schematic cross-sectional view of a feature of a device 400, according to an embodiment of this invention. The feature 400 is a via. The feature or via 400 will now be discussed in more detail. The feature or via 400 is part of an integrated circuit packaging substrate (120) which, as mentioned earlier. The via 400 includes a first level of circuitry 410 and a second level of circuitry 420. The via 400 also includes a cylindrical portion of barrel 402. As shown in FIG. 4A the cylindrical portion is frusto-conically shaped. The via 400 also includes a base 404. The base 404 is mechanically and electrically joined to the second level of circuitry 420 at the joint or adhesion area 440. The joint or adhesion area is depicted by the reference numeral 440 and also shown encircled in FIG. 4A.

Figure 4B:
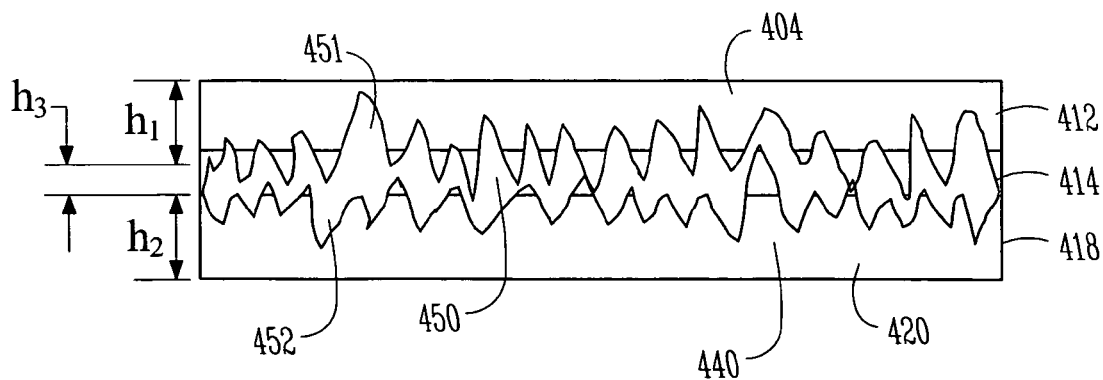
FIG. 4B illustrates a schematic cross-sectional view of a feature of a device, at the location where the feature is electrically connected to a level of circuitry, according to an embodiment of this invention.

FIG. 4B illustrates a schematic cross-sectional view of the feature 400 of a device at the location where the feature 400 is electrically connected to the second level 420 of circuitry, according to an embodiment of this invention. The base 404 of the via or device 410 includes an electrolytic copper layer 412 and an electroless copper layer 414. The second level of circuitry 420 also includes an electrolytic copper layer 418. The area also includes an interfacial adhesion layer 450. The interfacial adhesion layer 450 is comprised of an interfacial adhesion material which is diffused into the electroless copper layer 414 and the electrolytic copper layer 418 associated with the second level of circuitry 420 as well as the electrolytic copper layer 412 associated with the base 404 of the feature or via 400. The interfacial adhesion layer 450 has a multiple inter-diffused structure. The individual inter-diffused structure, such as tooth 451, extend from the electroless copper layer 414 into the electrolytic copper layer 412 associated with the base 404 of the feature or via 400. Other individual inter-diffused structure, such as a tooth 452, extends between the electrolytic copper layer 418 and the electroless copper layer 414. The inter-diffused structures of the interfacial adhesion layer 450 produces an enhanced mechanical bond at the interface between the base 404 of the feature or micro-via and the second level of circuitry 420 associated with the integrated circuit packaging substrate 110 shown in FIG. 1.

An integrated circuit packaging substrate includes a first layer of conductive material 410, and a second layer of conductive material 420. The integrated circuit packaging substrate also includes a feature or via 400 for interconnecting the first layer of conductive material 410 and the second layer of conductive material 420. The via 400 further includes a base 404 positioned at the second layer of conductive material 420. The base 404 includes a conductive material 414, 418 and an interfacial adhesion material 450. The interfacial adhesion material 450 forms a solid solution with the conductive material 412, 414, 418. In one embodiment, the interfacial adhesion material 450 is palladium and the conductive material 412, 414, 418 is copper. The palladium forms a solid solution with the copper. In some embodiments the interfacial adhesion material 450 interdiffuses with the conductive material 412, 414, 418. The interdiffusion of the interfacial adhesion material and the conductive material is nonuniform. The interdiffusion of the interfacial adhesion material and the conductive material forms a plurality of structures 451, 452 that extend into the conductive material 412, 414, 418. The plurality of inter-diffusion structures 451, 452 form a stitched bonding between the base 404 of the feature or via 400 and the second level of circuitry 420 to which the via 400 connects. The inter-diffused structures 451, 452 or the stitched bonding prevents failures at the interface between the base 404 of the feature or via 400 and the second level of circuitry 420.

Figure 5A:
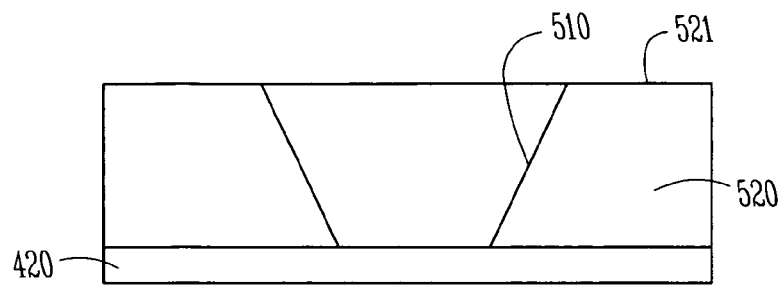
FIG. 5A illustrates the initial stages of formation of a via in a semiconductor device, according to an embodiment of this invention.

Now turning to FIGS. 5A to 5E, the details of the formation of the inter-diffused structure or interfacial adhesion layer 450 will now be discussed. FIG. 5A illustrates formation of the feature at its initial stages, according to an embodiment of the invention. In order to form a via, initially an opening is drilled. A blind hole or an opening 510 is drilled through to the base of the electrolytic copper layer associated with the second level of circuitry 420. The opening 510 can be made with any sort of tool. In this particular embodiment, for a miniaturized via, or a micro-via, the opening 510 is formed using a laser. The opening 510 is made in a substrate 520 which previously covered the second level of circuitry 420 in the integrated circuit packaging substrate. The substrate 520 includes a top surface 521.

Figure 5B:
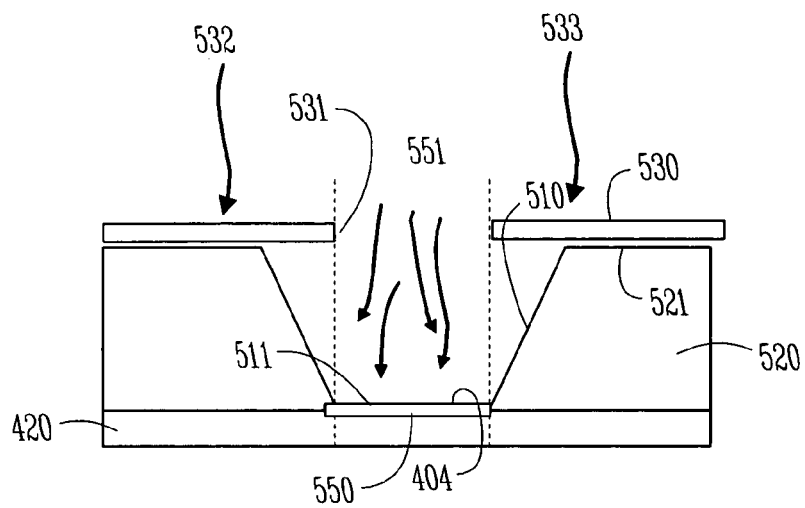
FIG. 5B illustrates another stage during the process of formation of a via in a semiconductor device, according to an embodiment of this invention.
Figure 5C:
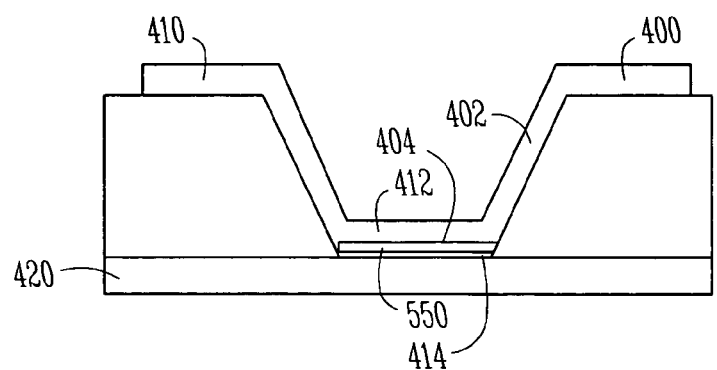
FIG. 5C illustrates yet another stage during the process of formation of a via in a semiconductor device, according to an embodiment of this invention.

FIG. 5B illustrates another stage during the process of formation of a via in an integrated circuit packaging substrate, according to an embodiment of this invention. As shown in FIG. 5B, surface 521 of the substrate 520 is masked with a mask 530. The mask 530 is treated to form an opening 531 therein. The diameter of the opening 531 is essentially equal to the diameter of the base of the via 404 (shown in FIGS. 4A and 5B). The diameter of the opening 531 is also equal to the diameter of the exposed portion of the second level of circuitry 420, which is found at the closed end of 511 of the opening 510. The closed end 511 of the opening 510 has exposed conductive material from the second level of circuitry 420. An interfacial material 550 is deposited on the mask and through the opening 531 in the mask 530 to the surface of the second level of circuitry 420 found at the closed end 511 of the opening 510. The deposition of the interfacial material 550 is depicted by the arrows 551 which are passing through the opening 531 in the mask 530 and by the arrows 532 and 533, which show that some of the interfacial layer material 550 is being deposited on the surface of the mask 530. In one embodiment the interfacial layer material that is being deposited is palladium (Pd). Also in some embodiments the palladium or interfacial or layer material is deposited using a selective sputtering process. The result, as shown in FIG. 5B, is a layer of interfacial material 550 deposited on the surface of the second level of circuitry 420 at the closed end 511 of the opening 510 in the substrate 520. The next step, as shown in FIG. 5C, is to remove the mask 530 and plate the opening 510. The closed end 511 of the opening is initially plated with a layer of electroless copper 414. Next the entire opening 510 is plated with a layer of electrolytic copper 412. The end result of this step is to form the base 404 of the feature or via 400 and the barrel portion 402 of the via 400. The plating process also forms the interconnection to the first level of electronic, depicted by reference numeral 410. It should be noted that the base 404 includes a layer of the interfacial adhesion material 555 as well as a layer of electroless copper 414 and a layer of the electrolytic copper 412.

Figure 5D:
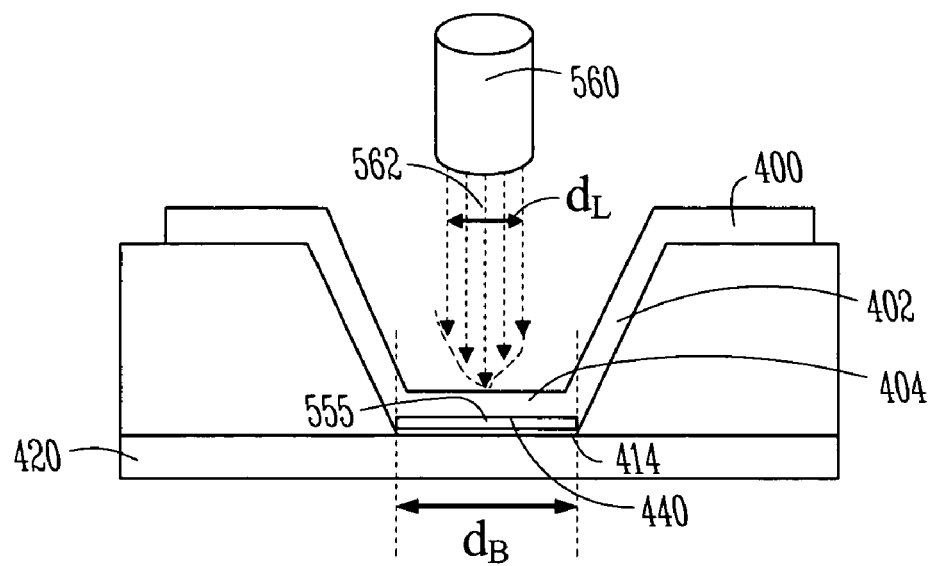
FIG. 5D illustrates still another stage during the process of formation of a via in a semiconductor device, according to an embodiment of this invention.

FIG. 5D illustrates still another stage during the process of formation of a via 400 in an integrated circuit packaging substrate, according to an embodiment of this invention. As shown in FIG. 5D a laser 560 directs a laser beam 562 toward or at the base 404 of the via or feature 400. The laser energy is depicted by the dotted arrows carrying the reference numeral 562. The laser energy 562 heats the joint area 440 to a range of approximately 400 to 600° C. The directing of the laser beams 562 toward the joint area 440 is also referred to as laser brazing. Laser brazing enhances diffusion of the interfacial adhesion materials, such as palladium, into the electroless layer 414 and into the electrolytic copper layer 412 and the electrolytic layer 418. The laser has a diameter $d_1$, which is approximately half the diameter of the diameter of the base 404 depicted by dB.

Figure 5E:
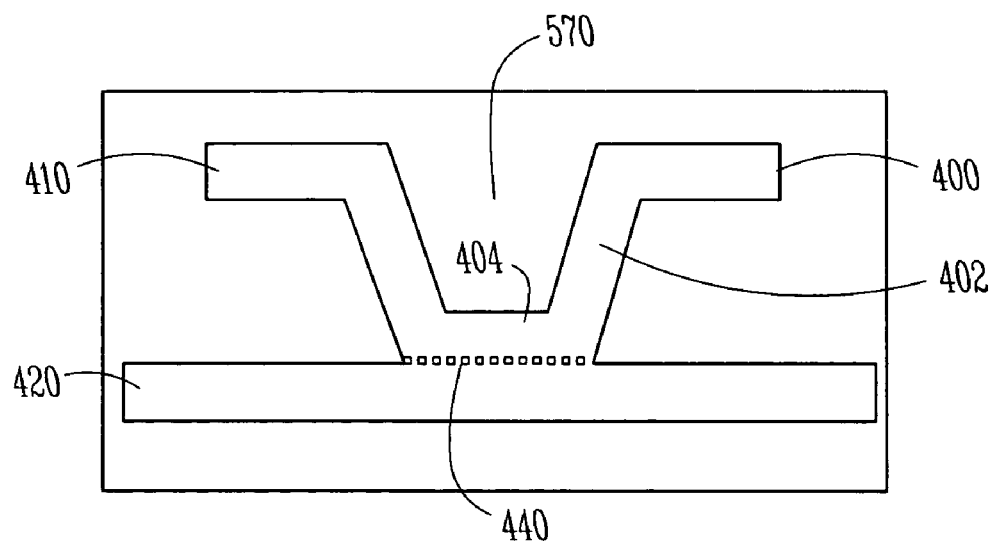
FIG. 5E illustrates a completed via formed by the process shown in FIGS. 5A–5D and further discussed in FIGS. 7–8, according to an embodiment of this invention.

FIG. 5E shows a completed via 400 formed by the process shown in FIGS. 5A to 5D and further discussed in FIGS. 7 and 8 below, according to an embodiment of this invention. After the laser step the via is capped with a cap 570. The end result is a via as shown in FIGS. 4A and 4B. This particular process is very good for any formation of a feature such as a via. This particular process is particularly effective when forming a micro-via.

Figure 6:
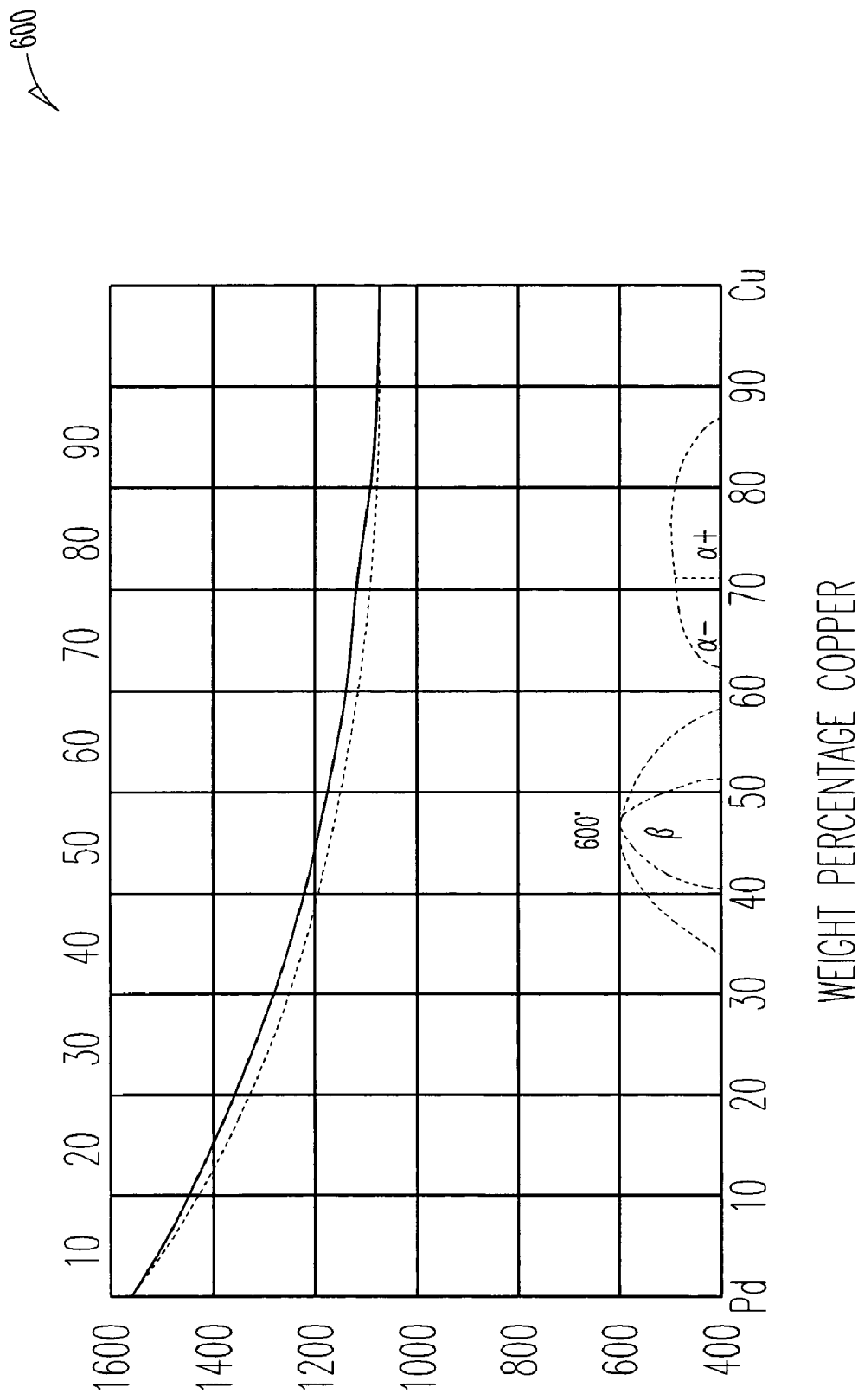
FIG. 6 is a Cu—Pd (Copper and Palladium) phase diagram showing the formation of an alloy of copper and palladium, according to an embodiment of this invention.

FIG. 6 is a Cu—Pd (Copper and Palladium) phase diagram 600 showing the formation of an alloy of copper and palladium, according to an embodiment of this invention. The phase diagram 600 shows that a Cu—Pd solid solution is formed at much lower temperatures than the temperature produced by directing energy from the laser 560 to the base 404 of the via 400, as shown in FIG. 5D above. At various weight percentages of Copper and Palladium, various phases of the compound of Cu—Pd are formed. The palladium forms a solid solution with the copper. In some embodiments the interfacial adhesion material 450 (shown in FIGS. 4A and 4B) interdiffuses with the conductive material 412, 414, 418 (shown in FIGS. 4A and 4B). The interdiffusion of the interfacial adhesion material and the conductive material is non-uniform. It is contemplated that the resulting structure 451, 452 (shown in FIGS. 4A and 4B) of the interfacial adhesion material 450 (shown in FIGS. 4A and 4B) includes alloys of copper and palladium as well as areas of high percentages of palladium and areas of high percentages of copper, in addition to the interdiffusion mentioned above. It is also contemplated that the interfacial adhesion material 450 will also include the alpha phase and beta phase Cu—Pd materials in addition to the interdiffusion of the copper and palladium. It should be noted that even though the above example shows deposition of a layer of palladium 555 on the surface of the second level of electronics 420 at the closed end of the opening 510, other adhesion materials could be substituted for palladium. For example, nickel, cobalt and platinum are some of the metals that could be used to form the interfacial adhesion area 450 used to stitch the via 400 to the second level of circuitry 420. In fact, any material that formed an interfacial adhesion area 450 used to stitch the via 400 to the second level of circuitry 420 is contemplated by this invention.

Figure 7:
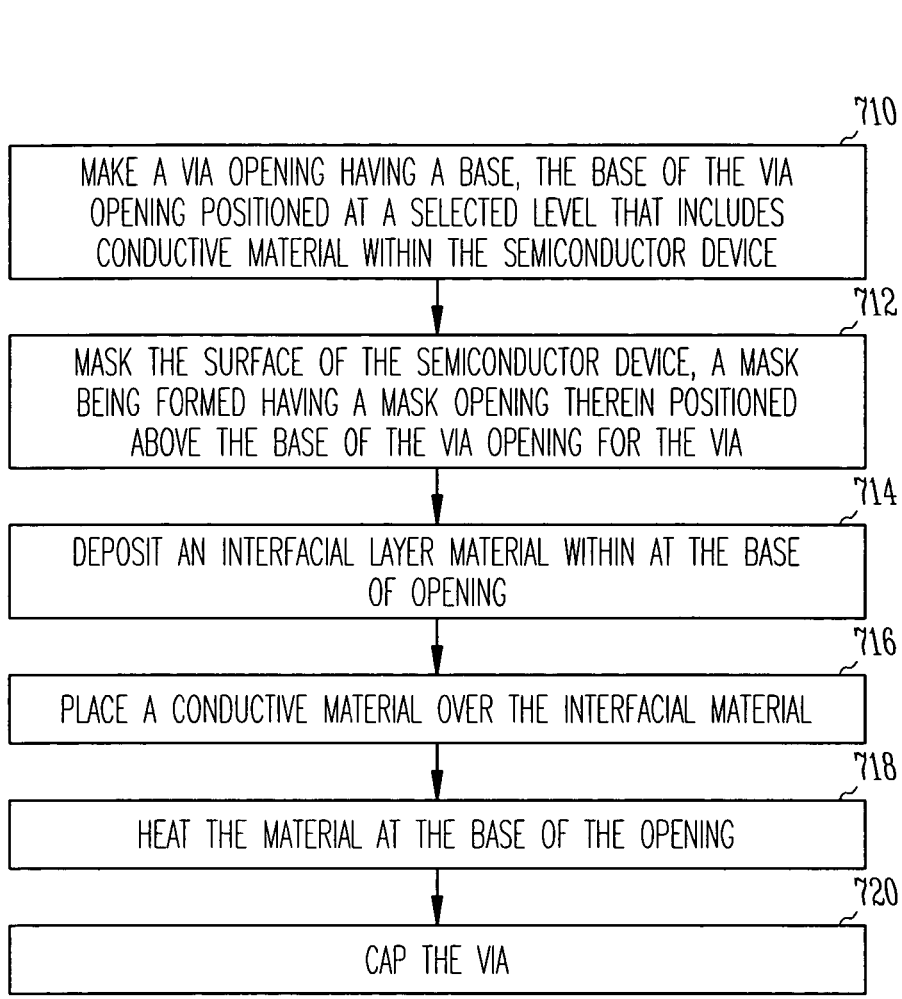
FIG. 7 is a flow diagram showing a method for forming a via in a semiconductor device, according to an embodiment of this invention.

FIG. 7 is a flow diagram showing a method for forming a via in a semiconductor device 700, according to an embodiment of this invention. The method for forming a via in an integrated circuit packaging substrate includes making a via opening having a base so that the base of the via opening is positioned at a selected level within an integrated circuit packaging substrate 710. The base may also adjoin conductive material within the integrated circuit packaging substrate. The method 700 also includes masking the surface of the semiconductor device 712. The mask formed has a mask opening therein positioned above to the base of the via opening. The method 700 also includes depositing an interfacial layer material within at the base of opening 714, placing a conductive material over the interfacial material 716, and heating the materials at the base of the opening 718. Depositing an interfacial layer material within the via opening includes sputtering the interfacial material onto the mask and into the via opening. The method further includes removing the mask.

The interfacial layer material 450 (FIGS. 4A–4B) is a material that will diffuse into the conductive material 414, 412, 418 (FIGS. 4A–4B) at the temperature produced by heating the materials at the base of the via opening. The interfacial material 450 (see FIGS. 4A–4B) may include palladium, platinum, cobalt or nickel. In one embodiment, the interfacial material 450 (FIGS. 4A–4B) includes palladium. Heating the materials at the base of the via opening includes directing energy from a laser 560 (see FIG. 5D) at the base 404 of the opening. The laser energy is higher at the center of the laser 560 (see FIG. 5D). In other words, the laser 560 has a Gaussian energy distribution. The laser 560 (see FIG. 5D) produces temperatures at the base 404 (see FIGS. 4A–4B) of the via opening in the range of 400 to 600 degrees C. The laser 560 (see FIG. 5D) has a diameter of approximately half the diameter of the base of the via opening. Placing a conductive material 414, 412 over the interfacial material 555 (see FIG. 5C) includes plating copper within the via opening. Placing a conductive material over the interfacial material further includes plating electroless copper at the base of the via opening, and plating the via opening with electrolytic copper. The method also includes capping the via.

Figure 8:
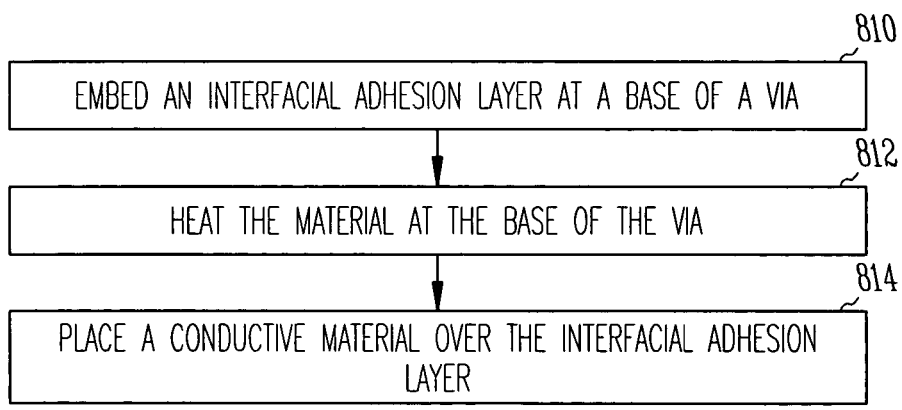
FIG. 8 is a flow diagram showing a method for forming a via in a semiconductor device, according to another embodiment of this invention.

FIG. 8 is a flow diagram showing a method for forming a via in an integrated circuit packaging substrate 800, according to another embodiment of this invention. The method for forming a via in an integrated circuit packaging substrate 800 includes embedding an interfacial adhesion layer at a base of a via 810, and heating the materials at the base of the via 812. Embedding the interfacial adhesion layer 810 further includes placing a conductive material over the interfacial adhesion layer 814. Heating the materials at the base of the via 412 includes directing the energy of a laser 560 (see FIG. 5D) at the base of the via. Heating the materials at the base of the via 812 includes heating the materials at the base of the via to a temperature within the range of 400–600 degrees C. The interfacial adhesion material interdiffuses with the conductive material. In some embodiments, the interdiffusion of the interfacial adhesion material and the conductive material is nonuniform and forms teeth-like structures that extend into the conductive layers at the base of the via.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method for forming a via in an integrated circuit packaging substrate comprising:
   making a via opening having a base, the base of the via opening positioned at a selected level that includes a first conductive material within the integrated circuit packaging substrate;
   depositing an interfacial layer material within the base of opening;
   placing a second conductive material over the interfacial material; and
   heating the materials at the base of the opening, wherein heating materials at the base of the via opening includes directing energy from a laser at the base of the opening.

2. The method for forming a via of claim 1 wherein the laser energy is higher at the center of the laser.

3. The method for forming a via of claim 1 wherein the laser produces temperatures at the base of the via opening in the range of 400 to 600 degrees C.

4. The method for forming a via of claim 1 wherein the laser has a diameter of approximately half the diameter of the base of the via opening.

5. A method for forming a via in an integrated circuit package substrate comprising:
   embedding an interfacial adhesion layer at a base of a via;
   placing a conductive material over the interfacial adhesion layer; and
   heating the interfacial adhesion layer and the conductive layer to form a solution that cools and includes teeth-like structures.

6. The method of claim 5 wherein embedding the interfacial adhesion layer further includes placing a conductive material over the interfacial adhesion layer.

7. The method of claim 5 wherein heating the interfacial adhesion layer and the conductive layer includes directing the energy of a laser at the base of the via.

8. The method of claim 5 wherein heating the interfacial adhesion layer and the conductive layer includes heating the interfacial adhesion layer and the conductive layer to a temperature within the range of 400–600 degrees C.

9. The method of claim 5 wherein heating the conductive material and the interfacial adhesion layer results in interdiffusion of the interfacial adhesion material and the conductive material.

10. The method of claim 9 wherein the interdiffusion of the interfacial adhesion layer and the conductive material is nonuniform.

11. The method of claim 9 wherein the interdiffusion of the interfacial adhesion layer and the conductive material forms teeth-like structures that extend into the conductive layer at the base of the via.

12. A method for forming a via in an integrated circuit package substrate comprising:
    placing an interfacial adhesion layer at a base of a via;
    placing a conductive material over the interfacial adhesion layer; and
    stitching the interfacial adhesion layer and the conductive material, wherein stitching the interfacial adhesion material and the conductive material includes forming teeth-like structures that extend into the conductive layers at the base of the via.

13. The method of claim 12 wherein stitching the interfacial adhesion layer and the conductive material includes forming a solution of the interfacial adhesion layer and the conductive material.

14. The method of claim 12 wherein stitching the interfacial adhesion layer and the conductive material includes forming a plurality of structures formed from alloys of the interfacial adhesion layer and the conductive material.

15. The method of claim 12 wherein stitching the interfacial adhesion layer and the conductive material includes heating the materials at the base of the via.

16. The method of claim 15 wherein heating the materials at the base of the via includes heating the materials at the base of the via to a temperature within the range of 400–600 degrees C.

17. The method of claim 15 wherein heating the materials at the base of the via includes directing a laser at the base of the via.

18. A method for forming a via in an integrated circuit package substrate comprising:
    placing an interfacial adhesion layer at a base of a via;
    placing a conductive material over the interfacial adhesion layer; and
    interdiffusing the interfacial adhesion layer and the conductive material to form tooth-like structures to stitch the interfacial adhesion layer and the conductive material.

19. The method of claim 18 wherein interdiffusing the interfacial adhesion layer and the conductive material includes forming a plurality of structures of the interfacial adhesion layer and the conductive material.

20. The method of claim 18 wherein interdiffusing the interfacial adhesion layer and the conductive material is achieved by heating the materials at the base of the via.

* * * * *